(12) United States Patent
Snyder (10) Patent No.: US 11,303,259 B2
(45) Date of Patent: Apr. 12, 2022

(54) METHOD AND CIRCUIT FOR BYPASSING SPURIOUS RESONANCE IN LUMPED, DISTRIBUTED AND WAVEGUIDE ELEMENT NETWORKS

(71) Applicant: Richard Snyder, Kinnelon, NJ (US)

(72) Inventor: Richard Snyder, Kinnelon, NJ (US)

(*) Notice: Subject to any disclaimer, the term of this patent is extended or adjusted under 35 U.S.C. 154(b) by 196 days.

(21) Appl. No.: 16/689,623

(22) Filed: Nov. 20, 2019

(65) Prior Publication Data
US 2020/0177150 A1 Jun. 4, 2020

Related U.S. Application Data

(60) Provisional application No. 62/773,311, filed on Nov. 30, 2018.

(51) Int. Cl.
*H03H 7/01* (2006.01)

(52) U.S. Cl.
CPC ........ *H03H 7/0115* (2013.01); *H03H 7/1766* (2013.01)

(58) Field of Classification Search
CPC .......................... H03H 7/0115; H03H 7/1766
USPC .................................................. 333/175, 176
See application file for complete search history.

(56) References Cited

U.S. PATENT DOCUMENTS

| 2010/0127804 A1* | 5/2010 | Vouloumanos | H01P 1/042 333/248 |
| 2013/0162374 A1* | 6/2013 | Tamiazzo | H01P 11/00 333/202 |

\* cited by examiner

*Primary Examiner* — Rakesh B Patel
(74) *Attorney, Agent, or Firm* — The H.T. Than Law Group (57) ABSTRACT

Disclosed herein are methods and circuits that prevent energy that would produce a spurious resonance from lumped, distributed or waveguide circuit elements by using for example a low pass filter with a cut-off below the first spurious resonance frequency and bypassing the energy at frequencies at or above the first spurious resonance frequency through a secondary path. This secondary path is high pass in nature, with a cutoff substantially similar to the low pass filter. The two paths are combined at the common output, using a lowpass matching network.

20 Claims, 7 Drawing Sheets

Figure 1 (Conventional)

Figure 4 (Conventional)

METHOD AND CIRCUIT FOR BYPASSING SPURIOUS RESONANCE IN LUMPED, DISTRIBUTED AND WAVEGUIDE ELEMENT NETWORKS

FIELD OF THE INVENTION

The present invention relates to a method and circuit for bypassing spurious resonance in lumped, distributed and waveguide electrical components.

BACKGROUND OF THE INVENTION

A major restriction on the width of passbands, e.g., high pass and bandstop filters, is presented by the unavoidable spurious resonances of the components used to implement the filters. Some of these resonances are intrinsic, such as the periodic or higher-order mode responses of distributed components, while others are due to parasitic reactive properties of lumped components.

Figure 1:
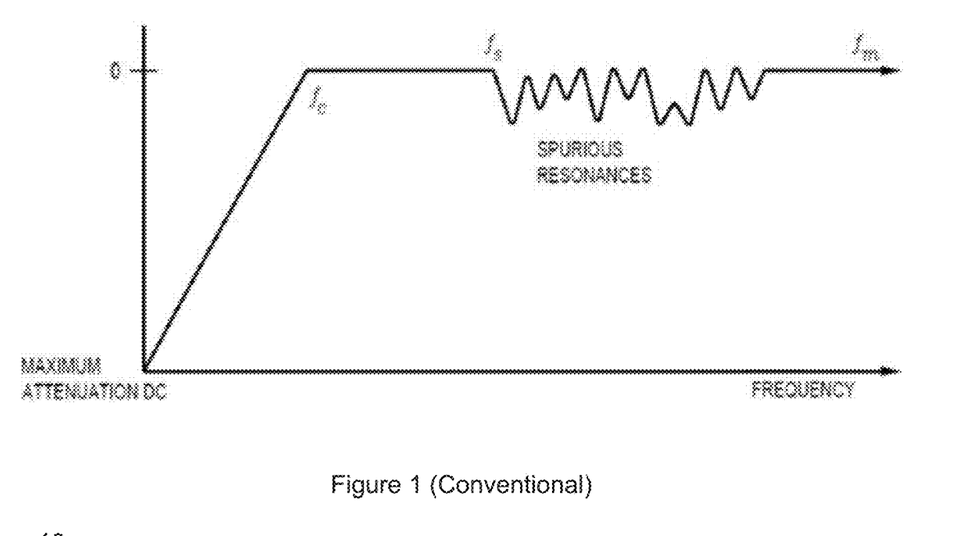
FIG. 1 is a representative plot of amplitude versus frequency showing the first spurious frequency located between the cutoff frequency of a high pass filter and the maximum band pass frequency.

A high pass filter network is required to provide attenuation below and low loss above, a frequency called the cut-off frequency (fc). Extending the low loss region as far as possible above the cut-off frequency is a known design challenge. The challenge is primarily the avoidance of spurious resonances or modes of resonance due to internal geometry. This is illustrated in FIG. 1, where the first spurious resonance frequency (fs) is located between fc and the desired maximum passband frequency (fm). In the case of waveguide high pass networks, higher order eigenmodes of the particular waveguide cross section are encountered. For distributed transverse electromagnetic (TEM) mode structures, periodicity limits the extent of the upper passband area. For example, short-circuited quarter wave length lines will again resonate at a three-quarter wavelength frequency. For lumped structures, parasitic properties, such as capacitance between inductor turns or inductance of the wires or lines connecting capacitors, cause self-resonance of the lumped components at frequencies above the cut-off frequency fc. Similar limitations of passband extent are found in the design of bandstop filters, particularly in the passband above the bandstop region.

As used herein, a merit factor (r) is defined as:

$$r = fs/fc.$$

In typical lumped high pass designs, the maximum achievable r is about 30. This means that the passband of a lumped high pass with fc of 30 MHz would not exceed about 900 MHz before encountering spurious resonances caused by parasitic resonances. As discussed in Bahl, I. J, *Lumped Elements for RF and Microwave Circuits*, Artech House, 2003, ISBN 1-58053-309-4 and in Matthaei, G. L and Yong, L. and Jones, E. M. T., *Microwave Filters, Impedance-Matching Networks, and Coupling Structures*, McGraw-Hill, 1964 (1980 edition is ISBN 0-89006-099-1), a classical high pass ladder-derived circuit design uses shunt connected inductors and series capacitors. A number of techniques are available to increase the value of r. The use of single-layer capacitors minimizes internal series inductance in the series capacitors. Connecting two inductors in series also series-connects the capacitance across the inductor coils, thus reducing the total capacitance and increasing the self-resonant frequency of the inductors. Parallel connection of single layer capacitors puts the connection inductances in parallel, thus reducing the parallel inductances and increasing the self-resonant frequency of the capacitors, as discussed in Bahl and in U.S. Pat. No. 4,751,465 entitled "Spurious Resonance Control for NMR Observe Coils." However, the conventional methods and circuits are only able to improve r to about 40, and in the case of a 30 MHz cut off high pass filter limit fm of the resonance-free passband to about 1200 MHz.

There remain needs to improve r for lumped electrical components, as well as distributed and waveguide components, and for improved methods and circuits to increase resonance-free fm.

SUMMARY OF THE INVENTION

Hence, the invention is directed to a method and a circuit that would prevent energy at a frequency range that if it were to impinge on the lumped, distributed or other waveguide circuit element would excite the lumped, distributed or other waveguide element to produce spurious resonance. A low pass filter with cutoff frequency just below the first spurious resonance diverts energy with higher frequencies to a secondary path. This secondary path is high pass in nature, with a cutoff almost identical to the low pass filter in the primary path. The two paths are combined at the common output, using a lowpass matching network. The recombined energy would have a full range of frequencies without spurious resonance.

As used herein, a "circuit element" or "element" is defined to include a combination of individual lumped, distributed or waveguide component forming a network for a special purpose, e.g., a low pass filter, a high pass filter, a band pass filter or a band stop filter.

One embodiment of the present invention relates to an electrical circuit comprising a primary path having a first low pass filter located upstream of a first circuit element and a parallel bypass path having a second circuit element. The first circuit element is capable of producing a first spurious resonance starting at a first spurious resonance frequency (fs) and the first low pass filter attenuates energy at frequencies of about fs and higher. The second circuit element passes energy from about fs to about a maximum bandpass frequency (fm) of the electrical circuit without producing another spurious resonance. The energies from the primary path and the bypass path are combined downstream of the first and second circuit elements.

In one embodiment of the present invention, the first circuit element comprises a first high pass filter and the second circuit element comprises a second high pass filter. The first high pass filter passes energy with frequencies from about its cut-off frequency (fc) to about fs, and the second high pass filter passes energy with frequencies from about fs to about fm.

In another embodiment of the present invention, the first circuit element comprises a first band block filter and the second circuit element comprises a third high pass filter. The first band block filter passes energy from a low frequency to its lower passband edge and then from its upper passband edge to fs, wherein the first band block filter attenuates frequencies within its notch band and said low frequency is lower than the frequencies within the notch band, which are lower than fs. The third high pass filter passes energy with frequencies from about fs to about fm. The low frequency can be a direct current (DC).

In yet another embodiment the inventive electrical circuit further comprises a second low pass band located downstream of the first circuit element, wherein the second low pass filter attenuates energy at frequencies of about fs and higher.

The present invention is not limited to circuits with any specific number of parallel bypass paths, but includes circuits with a N number of bypass paths to handle any number of spurious resonance frequencies.

The r merit factor for the inventive electrical circuit, which can be defined as fs or fm, whichever is higher divided by fc, is equaled to the r of the first circuit element times the r of the second circuit element.

Another embodiment of the present invention relates to a method for minimizing or preferably preventing spurious resonance in an electrical circuit comprising a plurality of circuit elements, said method comprises the steps of:

(a) selecting a first circuit element capable of producing a first spurious resonance and ascertaining a first starting spurious resonance frequency (fs) of said first spurious resonance;

(b) dividing an input energy having frequencies from a low frequency to a maximum bandpass frequency (fm) into a first energy having frequencies from the low frequency to fs and a second energy having frequencies from fs to fm;

(c) passing the first energy through said first circuit element;

(d) bypassing the second energy around said first circuit element; and (e) combining the first and second energies.

The first energy is passed through a primary path that contains the first circuit element and the second energy is passed through a bypass parallel path.

The first circuit element may be a first high pass filter or may be a first band stop filter located on the primary path. The parallel bypass path may be a second high pass filter.

The low frequency can be a DC or a cut-off frequency (fc) of the first high pass filter.

In another embodiment, a third energy having frequencies from DC to fc is passed through a third branch.

In yet another embodiment the inventive method further comprises the step of ascertaining a second spurious resonance and second starting spurious resonance frequency.

BRIEF DESCRIPTION OF THE DRAWINGS

In the accompanying drawings, which form a part of the specification and are to be read in conjunction therewith and in which like reference numerals are used to indicate like parts in the various views:

FIGS. 7(*a*)-7(*b*) are graphs of the return loss and insertion loss as a function of frequency of the inventive Band 2 shown in FIG. 3 from 30 MHz to 6000 MHz;

FIGS. 8(*a*)-8(*b*) are block diagrams of other embodiments of the present invention.

DETAILED DESCRIPTION OF THE PREFERRED EMBODIMENTS

An aspect of the present invention is directed to a method or a circuit for avoiding the parasitic or spurious resonance response from a lumped component by using at least one secondary path to bypass the frequency range that would incite the spurious resonances, along with a lowpass network preventing the incidence of that frequency range into the spurious-producing network.

Figure 2:
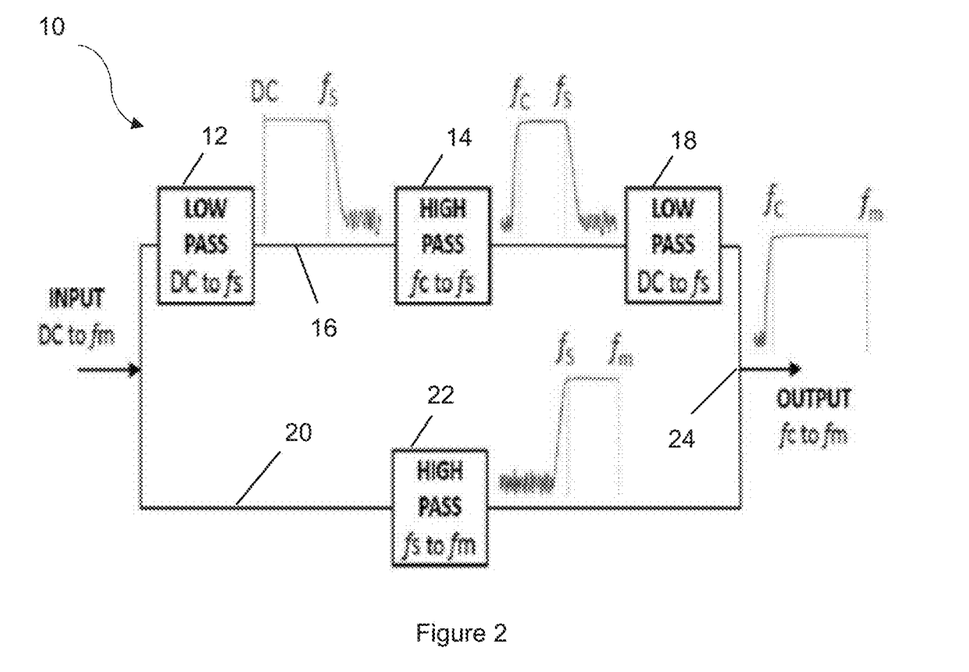
FIG. 2 is a block diagram of an embodiment of the inventive spurious resonance bypassing circuit.

An exemplary circuit 10 and non-limiting example of the present invention is shown in FIG. 2. Energy having frequencies from about zero, i.e., DC, to the maximum bandpass frequency (fm) or higher is inputted to circuit 10 from the left. Low pass filter 12, which preferably has a cut-off at or below the first spurious resonance fs of high pass filter 14, allows only energy with frequencies less than fs of high pass filter 14 to pass through to upper or primary branch 16. Thereafter, the energy on upper branch 16 impinges on high pass filter 14, which allows energy having frequencies from its cut-off frequency fc to the first spurious resonance frequency fs or below to pass through. Since this energy does not excite high pass filter 14 at its internal spurious resonance frequencies, the spurious resonance is avoided. A second low pass 18, which may be omitted in some embodiments, with a cut-off frequency at fs can be provided downstream of high pass filter 14 to ensure that no frequency above fs is passed through upper branch 16.

The portion of the input energy having frequencies from the first spurious frequency fs of high pass filter 14 to the maximum passband frequency fm diverted by low pass 12 is diverted to lower parallel branch 20, where this energy is passed through high pass filter 22, which allows frequencies from fs to fm to pass therethrough to filter out any frequencies above a preferred fm. Thereafter, the energies from upper branch 16 and lower branch 20 of circuit 10 are combined at component(s) 24 to output resonance-free energy at the desired frequencies from fc to fm. In this example, the energy from DC to fc is not outputted.

In this example, energy from a cut-off frequency fc to a maximum passband frequency fm is desired. However, a single conventional high pass filter from fc to fm would produce spurious resonance starting at fs between fc and fm, as illustrated in FIG. 1, and the r factor (fs/fc) would be low. In accordance to an embodiment of the present invention, two different high pass filters 14, 22 having different and preferably non-overlapping ranges of spurious resonance frequencies located on two branches of a circuit are used. The spurious resonance frequency ranges for high pass filters 14 and 22 can be readily determined by passing energy from DC to fm or higher and measuring the output. The full frequency range from fc to fm is divided into the first frequency range, from fc to fs or just below, and the second frequency range, from fs or just below to fm, wherein fs is the first spurious resonance of the first high pass filter 14. The first frequency range does not incite a spurious resonance response from the first high pass filter 14, since fc is so chosen. The second high pass filter 22 is chosen not to have a spurious response in the second frequency range.

As used in the examples above and below and in the discussion herein, the term "high pass filter" designates filters that passes frequencies from a lower frequency to the maximum bandpass frequency, fm. Since it is not practical or possible to reach a frequency of infinity, fm is used instead. The term "band pass filter" is not preferred even though these filters pass frequencies between a lower and an upper frequency limits for this same reason.

Other components in circuit 10, such as the low pass filter 12 or 18 and other filters, are preferably also chosen not to have a spurious resonance response within their operating frequency ranges, e.g., DC to fs or DC to fm.

Frequencies that would spuriously resonate in the most selective portion of the network, e.g., high pass filter 14, is prevented from reaching that network. A low pass filter, e.g., low pass filter 12, with a cut off below fs precedes the selective high pass network. The low pass rejects the frequencies that would have caused spurious resonance, which are then diplexed to another complementary (with respect to the low pass) high pass with a cut off of less than fs, e.g., high pass filter 22. This complementary high pass is only required to display a low value of r (in the example discussed below, a value of about 4 to about 5). The frequencies that would have caused spurious resonance are thus routed around the selective high pass, and recombined at a common output, e.g., at reference number 24, as shown in FIG. 2. An optional, additional low pass network is incorporated at the output of the selective high pass filter (fc to fs) to prevent spurious frequency energy from affecting the components nearest the output, and to form a quasi-complementary match to the low r-value high pass 22 (fs to fm).

Figure 3:
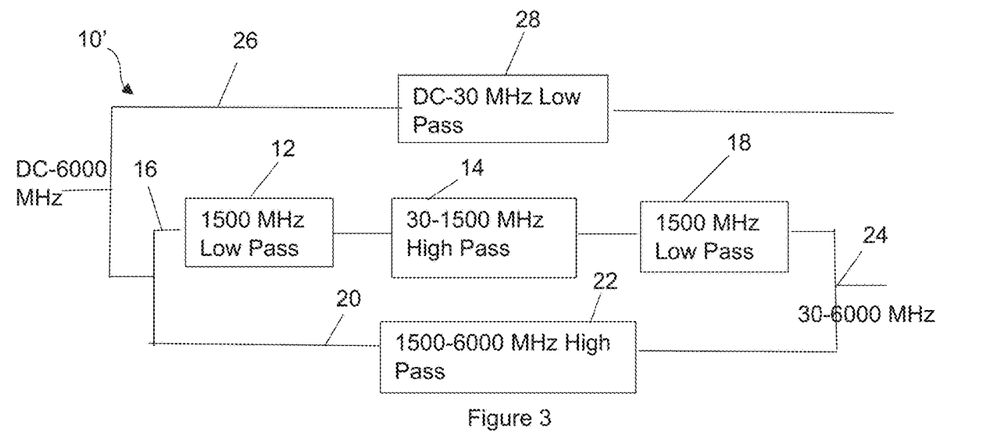
FIG. 3 is a block diagram of another embodiment of the inventive spurious resonance bypassing circuit.

A variation of circuit 10 is illustrated in FIG. 3. Circuit 10' contains a third parallel branch 26 which has low pass filter 28, which passes frequencies from DC to fc of high pass 14. In circuit 10' energy from DC to fc is diverted or passed to branch 26 and can either be transported to another circuit or electronic equipment or be recombined at reference number 24. The input energy at the left of circuit has three branches into which to divide. Frequency range from DC to fc is diverted into branch 26; frequency range from fc to fs is diverted into primary branch 16; and frequency range from fs to fm is diverted to branch 20. Non-limiting, exemplary values for the low pass filters and the high pass filters are included in FIG. 3 to illustrate the example below.

An exemplary circuit was built in accordance with circuit 10' shown in FIG. 3. This example is an implementation of a high pass filter with fc at about 30 MHz with a passband above cut off extending to fm of about 6,000 MHz. A conventional lumped component high pass design typically displays a maximum ratio between the first spurious frequency and the cut off frequency (r) of no more than 40 to 1. This would limit fm of the conventional single lumped high pass filter to about 1200 MHz.

In this example, Band 1 is branch 26 and Band 2 comprises the branches 16 and 20. The design criteria are as follows:

Type: Diplexer
Input and Output Impedance: 50 Ohms nominal
Crossover Frequency: 30 MHz
Band 1: 1-30 MHz minimum (Goal: DC or as close to DC to 30 MHz)
Band 2: 30 MHz-6 GHz minimum (Goal: 30 MHz to 18 GHz or as high as possible)
Band 1 to band 2 rejection: 25 dB (except within ±7.5 MHz of crossover region)
Band 2 to band 1 rejection: 25 dB (except within ±7.5 MHz of crossover region)
Isolation from output 1 to output 2: 25 dB (except within ±7.5 MHz of crossover region)
Maximum in band insertion loss for band 1: 1.0 dB except within ±15 MHz of crossover region Maximum in band insertion loss for band 2: 2.5 dB except within ±15 MHz of crossover region
Maximum return loss at inputs for band 1 and 2: 10 dB except within ±15 MHz of crossover region
Temperature: −40° C. to +60° C.
Input power: 1 Watt on Band 1 and 2 Watts on Band 2
Housing dimensions: 1.6"×1.6"×0.5" or smaller excluding connectors.

The present inventor encountered no spurious resonance in Band 1 (low pass filter 28—DC to 30 MHz) in branch 26, and a single lumped component can be used as low pass filter 28. Band 1 is connected or diplexed to Band 2 circuit in a conventional manner, e.g., with complementary crossover frequency using the reflected impedance from the 30-1500 MHz high pass (fc to fs shown in FIG. 2), as discussed in Wenzel, R., "Application of Exact Synthesis Methods of Multichannel Filter Design," T-MTT, January 1965, which is incorporated herein in its entirety. The diplexing connection is visible FIG. 6, which is a photograph of circuit 10'.

Figure 4:
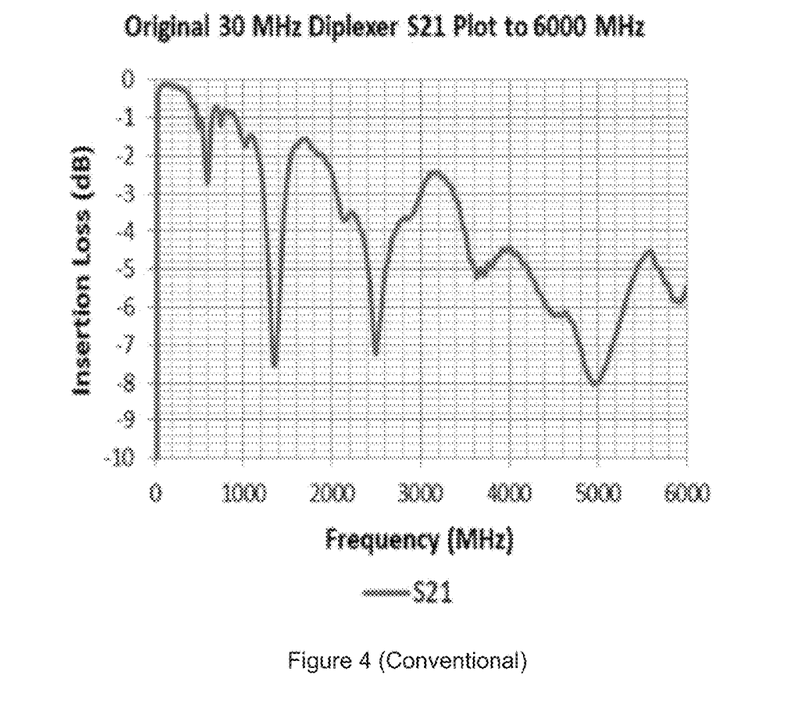
FIG. 4 is a graph of the insertion loss as a function of frequency for a conventional single high pass filter from 30 MHz to 6000 MHz.

In the design parameter, Band 2 is to provide a high pass characteristic from 30 MHz to 6000 MHz. A direct conventional implementation, i.e., using a single conventional lumped high pass filter from 30-6000 MHz, encountered spurious resonance at 1200 MHz as shown in FIG. 4. The insertion losses, as shown in FIG. 4, can be as high as −8 dB. This conventional implementation results in r=1200-30 or about 40, which is low and inefficient. For the graphs presented in the present invention, the legend "S21" designates the transmitted signal and the legend "S11" designates the reflected signal, expressed in voltage relative to a unit input. These are so-called S (or "scattering") parameters and are standard notation for transfer characteristics of networks.

Figure 5:
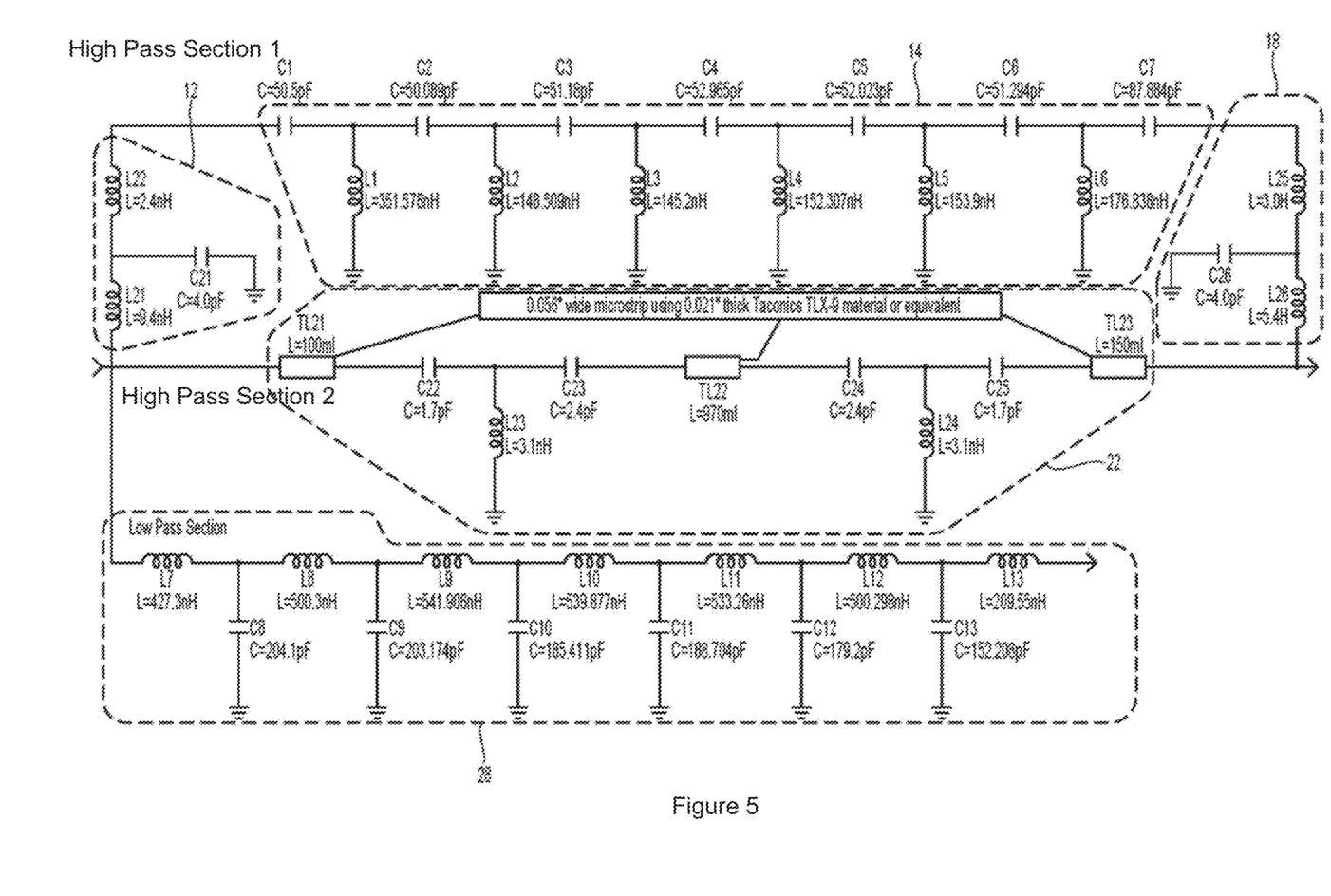
FIG. 5 is a circuit diagram of the embodiment of FIG. 3.
Figure 6:
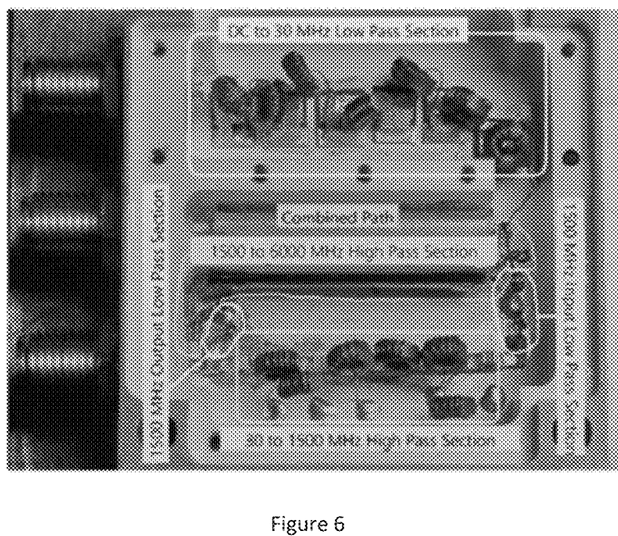
FIG. 6 is a photograph of an electrical circuit built in accordance with the example shown in FIG. 5.
Figures 7A, 7B:
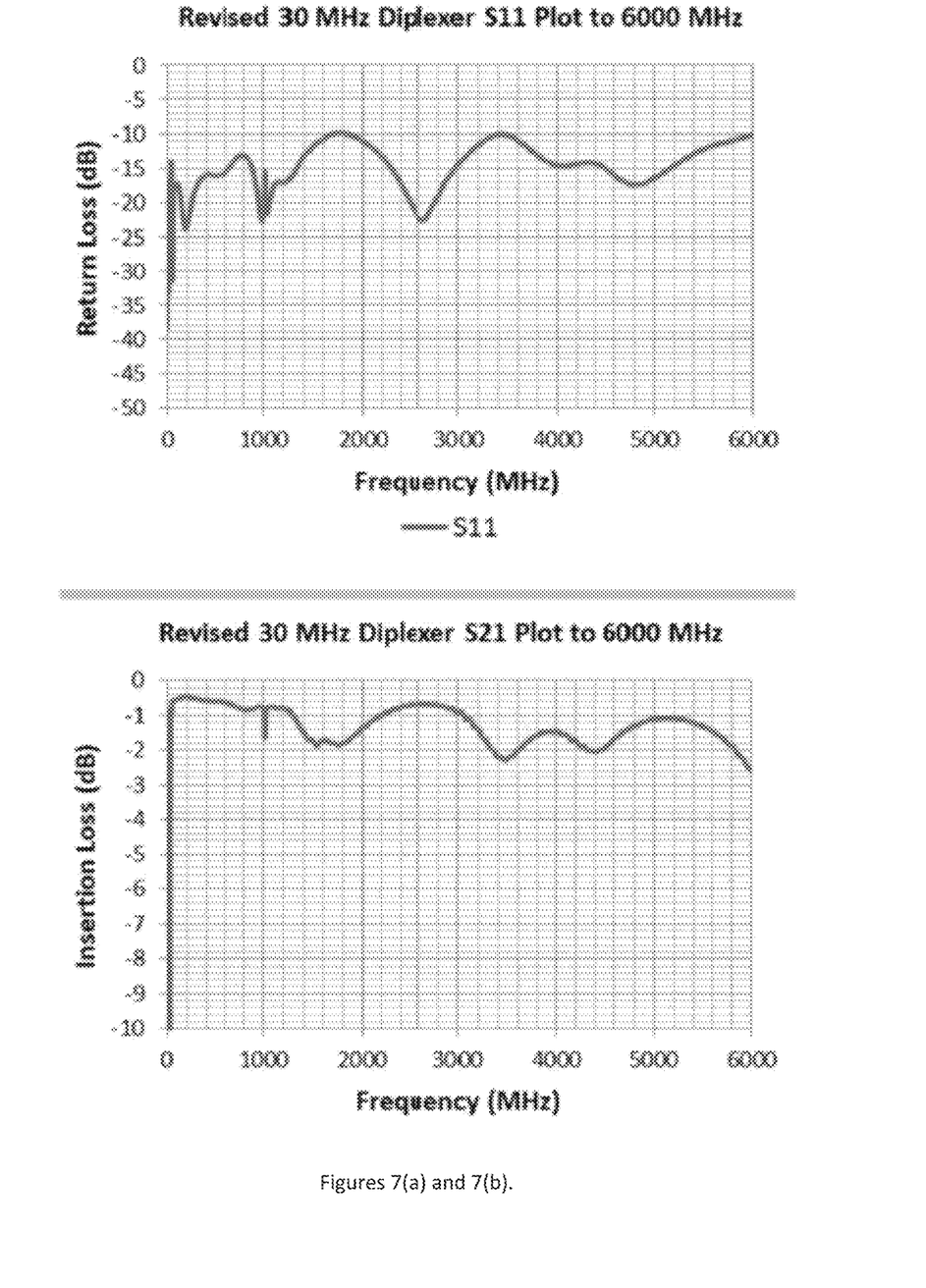

The inventive Band 2 is constructed in accordance with circuit 10' of the present invention as shown schematically in FIG. 3. An actual exemplary construction diagram is shown in FIG. 5, and a photograph of the actual exemplary circuit construction is shown in FIG. 6. The insertion losses for the inventive Band 2 is no more than −2.5 dB as shown in FIG. 7(b), and no spurious resonance is detected. The return loss, as shown in FIG. 7(a) also shows no spurious resonance. Advantageously, the cumulative r factor for inventive Band 2 is (6000 MHz÷30 MHz) about 200. The individual r factor for high pass filter 22 is (6000 MHz÷1500 MHz) about 4 and the individual r factor for high pass filter 14 is (1500 MHz÷30 MHz) about 50. Advantageously, the individual r factors in the two high pass filters in the inventive Band 2 are multiplicative to arrive at the cumulative r for inventive Band 2.

The low pass shown in FIG. 2 (from DC to slightly below fs) is a 3rd order, as is the low pass matching network at the common output junction. The 3rd order is sufficient to achieve the preferred 25 dB rejection of spurious responses. More demanding specifications (more rejection, different input and output impedances) would entail the use of higher order lowpass sections, perhaps unequal at input and output, but insertion loss would be increased. The response of the composite structure is shown in FIGS. 7(a) and 7(b). In the design example, a short length of transmission line is used to combine the Band 1 (DC-30 MHz) with the Band 2 (30 MHz-6 GHz) and bring the DC-6000 MHz energy to/from a common port, centered between the Band1 and Band 2 ports. The line adds a small additional insertion loss, and so the final circuit loss in Band 2 is 2.6 dB against a specification of 2.5 dB.

The present invention is not limited to the selective portion of the network being a high pass filter 14, discussed above. The selective portion of the network can be other lumped electrical component(s), such as high pass filter, a low pass filter, a band stop filter or a band pass filter. Moreover, the selective portion of the network may comprise more than one lumped electrical components.

In a generalized embodiment of the present invention, the inventive method and/or circuit may be applied to any network that contains one or more lumped, distributed or other waveguide components, i.e., "circuit elements." A selective portion of the network, such as a high pass filter or a band stop filter, is first identified. A spurious or parasitic response, if any, of that selective portion of the network is ascertained, e.g., by passing an energy or a signal comprising a wide range of frequencies, preferably including the operating frequency range, through the selective portion of the network, as illustrated in FIG. 1. The operating frequency range, i.e., the frequency range that the network is expected to encounter during operation, is divided into a first frequency range from the cut-off frequency of the selective lumped component to just below the first spurious resonance of the selective lumped component, and a second frequency range from just below said first spurious resonance to the maximum passband frequency. Energy carrying the first frequency range would travel through the primary path that includes the selective lumped component, and energy carrying the second frequency range would be diverted to a secondary branch that contains a corresponding lumped component, e.g., a similar or complementary filter operating at the second frequency range, that preferably would not vibrate in a spurious resonance frequency in the second frequency range. The energies from the primary and secondary paths would then be recombined to an energy with a full range of operating frequencies without spurious resonance.

In an example shown in FIG. 8(a), the selective "circuit element," which is defined above to include lumped, distributed or other waveguide components, or network is a band stop filter 30 that attenuates energy in the block band or notch, which could be any frequency range, and passes energy below and above the block band at low noise. In this example, a band stop filter 30, which is located in a primary path 32, has a first spurious resonance fs at about 3 GHz.

In this circuit, a low pass filter 34 with a cut-off frequency at about 3 GHz or just below diverts energy at 3 GHz or higher to a secondary path 36 to minimize or prevent band stop filter 30 from producing a spurious resonance response. Energy at 3 GHz or higher is passed through secondary path 36 that includes a high pass filter 38 that passes energy between 3 GHz and 18 GHz. Energies from the primary and secondary paths 32, 36 from DC to 18 GHz with the predetermined notch are recombined downstream, as shown.

Figure 8A:
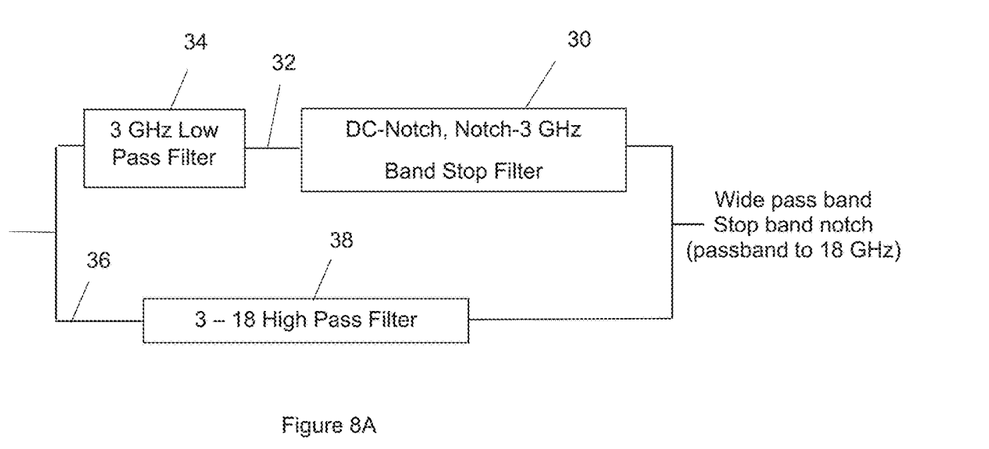
Figure 8B:
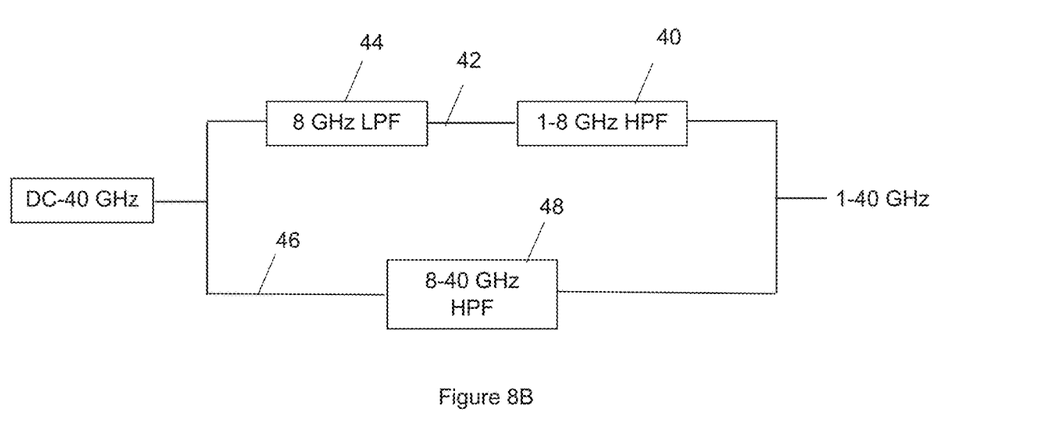

Another example is shown in FIG. 8(b), passing energy in a wide frequency range, such as 1-40 GHz, without spurious or parasitic resonance is a difficult task as known in the art. The present inventor believes that a single conventional lumped high pass filter would produce a spurious resonance at about 8 GHz. In this example, a high pass filter 40 that passes energy between 1 and 8 GHz is provided on a primary path 42. High pass filter 40 does not produce a spurious resonance in this frequency range. A low pass filter 44 diverts energy at 8 GHz or fs and higher to a secondary path 46 and another high pass filter that passes energy from about 8 GHz to 40 GHz, preferably without spurious resonance. Energies from both paths 42 and 46 are recombined afterward to produce energy from 1 GHz to 40 GHz without spurious resonance.

A second low pass filter, such as low pass filter 18 shown in FIGS. 2, 3, 5 and 6, can be incorporated into the embodiments shown in FIGS. 8(a) and 8(b).

In yet another broad embodiment, the first spurious resonance frequency (fs) of any and preferably all lumped electrical components, such as a band pass filter, a high pass filter, a low pass filter or a band stop filter, in a network is known or can be readily determined by passing a signal covering a wide range of frequencies, including the operating frequencies, through the components, as illustrated in FIG. 1. Some lumped, distributed or other waveguide components may not have aft in the operating frequency range. Thereafter, a subrange of frequencies that includes the spurious resonant range(s) of a lumped component is diverted or bypassed to another branch of the circuit, so that this subrange of frequencies would not incite said lumped, distributed or other waveguide component thereby the generation of the spurious resonance by the lumped, distributed or other waveguide component is avoided. The frequency subrange from the cut-off frequency (fc) to fs continues to pass through the lumped component without generating spurious resonance. Thereafter, the two branches of the circuit are recombined downstream.

The scope of the present invention would include circuits with three or more branches depending on the number of spurious resonances identified, e.g., FIGS. 3, 5 and 6. In other words, a plurality of spurious resonance frequency bands are present and the operating frequency range may be divided into multiple subranges to be diverted through a circuit or network with sufficient number of branches to avoid the spurious resonances.

Figure 9:
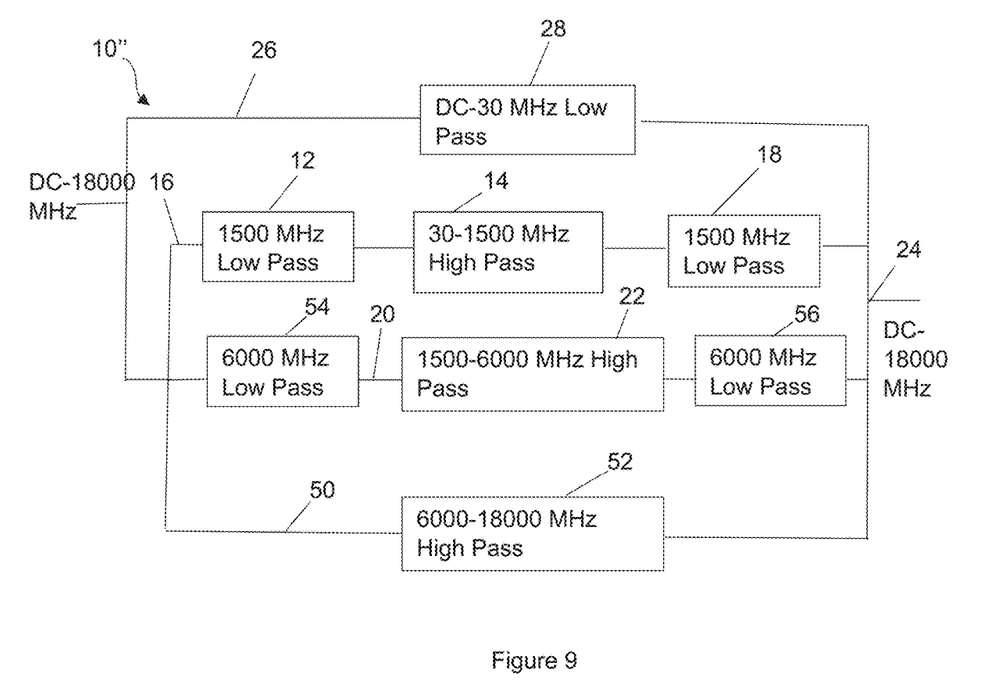
FIG. 9 is another block diagram of another embodiment of the present invention.

One non-limiting example of a circuit with three or more branches is illustrated by circuit 10" shown in FIG. 9. In this example, two or more spurious resonance frequency ranges are identified. High pass 14 has a first spurious resonance frequency range, e.g., at above 1500 MHz and as shown energy above this first spurious resonance frequency is diverted away from primary branch 16. High pass filter 22 in secondary branch 20 in this example has a second spurious resonance frequency range, e.g., at above 6000 MHz. Hence, it is advantageous to divert energy above 6000 MHz away from high pass filter 22. In this example, a tertiary branch 50 is provided to receive the diverted energy above 6000 MHz. This energy is passed through high pass filter 52, which preferably has no spurious resonance frequency from the second spurious resonance frequency to the frequency of the maximum band pass (fm), which in this example may be 18000 MHz. Preferably, similar to primary path 16, secondary path 20 also contains a low pass 54 in front of pass high 22 and an optional low pass 56 thereafter to ensure that frequencies that would induce spurious resonance in high pass 22 would not be passed therethrough. Also as shown, energy at frequencies from DC to the low cut-off frequency of first high pass 14 is diverted to branch 26 that can be combined downstream. Non-limiting, exemplary values for the low pass filters and the high pass filters for circuit 10" are included in FIG. 9 to illustrate this example.

The teachings from circuits 10, 10' and 10" can be readily used by those of ordinary skills in the art to design circuits with a N number of parallel bypass paths to handle any number of spurious resonance frequencies.

While it is apparent that the illustrative embodiments of the invention disclosed herein fulfill the objectives stated above, it is appreciated that numerous modifications and other embodiments may be devised by those skilled in the art. Therefore, it will be understood that the appended claims are intended to cover all such modifications and embodiments, which would come within the spirit and scope of the present invention.

What is claimed is:

1. An electrical circuit comprising a primary path having a first low pass filter located upstream of a first circuit element and a parallel bypass path having a second circuit element,
    wherein the first circuit element is capable of producing a first spurious resonance starting at a first spurious resonance frequency (fs) and wherein the first low pass filter attenuates energy at frequencies of about fs and higher,
    wherein the second circuit element passes energy from about fs to about a maximum bandpass frequency (fm) of the electrical circuit without producing another spurious resonance, and
    wherein the energies from the primary path and the bypass path are combined downstream of the first and second circuit elements.

2. The electrical circuit of claim 1, wherein the first circuit element comprises a first high pass filter and the second circuit element comprises a second high pass filter,
    wherein the first high pass filter passes energy with frequencies from about a cut-off frequency (fc) thereof to about fs, and
    wherein the second high pass filter passes energy with frequencies from about fs to about fm.

3. The electrical circuit of claim 2 further comprising a second parallel low bypass path comprising a third low pass filter, wherein the third low pass filter attenuates energy at frequencies higher than fc.

4. The electrical circuit of claim 2,
    wherein r is defined as fs or fm, whichever is higher divided by fc, and
    wherein r of the electrical circuit is r of the first circuit element times r of the second circuit element.

5. The electrical circuit of claim 1, wherein the first circuit element comprises a first band block filter and the second circuit element comprises a third high pass filter,
    wherein the first band block filter passes energy from a low frequency to fs, wherein the first band block filter attenuates frequencies within its notch band and said low frequency is lower than the frequencies within the notch band, which are lower than fs,
    wherein the third high pass filter passes energy with frequencies from about fs to about fm.

6. The electrical circuit of claim 5, wherein the low frequency is a DC.

7. The electrical circuit of claim 1 further comprising a third parallel bypass path comprising a fourth low pass filter located upstream of a fourth circuit element, wherein the fourth circuit element is capable of producing a second spurious resonance starting at a second spurious resonance frequency (fs2) and wherein the fourth low pass filter attenuates energy at frequencies of about fs2 and higher, and wherein fs2 is different than fs.

8. The electrical circuit of claim 7, wherein the energy from the third parallel bypass path is combined with the energies from the primary and parallel bypass path.

9. The electrical circuit of claim 7, wherein the third parallel bypass path further comprises a fifth low pass filter located downstream of the fourth circuit element, wherein the fifth low pass filter attenuates energy at frequencies of about fs2 and higher.

10. An electrical circuit comprising a primary path having a first low pass filter located upstream of a first circuit element and a parallel bypass path having a second circuit element,
    wherein the first circuit element is capable of producing a first spurious resonance starting at a first spurious resonance frequency (fs) and wherein the first low pass filter attenuates energy at frequencies of about fs and higher,
    wherein the second circuit element passes energy from about fs to about a maximum bandpass frequency (fm) of the electrical circuit without producing another spurious resonance, and
    wherein the energies from the primary path and the bypass path are combined downstream of the first and second circuit elements
    wherein the primary path further comprises a second low pass filter located downstream of the first circuit element, wherein the second low pass filter attenuates energy at frequencies of about fs and higher.

11. A method for minimizing spurious resonance in an electrical circuit comprising a plurality of circuit elements, said method comprises the steps of:
    (a) selecting a first circuit element capable of producing a first spurious resonance and ascertaining a first starting spurious resonance frequency (fs) of said first spurious resonance;
    (b) dividing an input energy having frequencies from a low frequency to a maximum bandpass frequency (fm) into a first energy having frequencies from the low frequency to fs and a second energy having frequencies from fs to fm;
    (c) passing the first energy through said first circuit element;
    (d) bypassing the second energy around said first circuit element; and
    (e) combining the first and second energies.

12. The method of claim 11, wherein the first energy is passed through a primary path that contains the first circuit element and the second energy is passed through a parallel bypass path.

13. The method of claim 12, wherein the first circuit element comprises a first high pass filter located on the primary path.

14. The method of claim 13, wherein the low frequency is a cut-off frequency (fc) of the first high pass filter.

15. The method of claim 14, wherein a third energy having frequencies from DC to fc is passed through a third branch.

16. The method of claim 13, wherein the bypass path contains a second high pass filter.

17. The method of claim 12, wherein the first circuit element comprises a first band stop filter.

18. The method of claim 17, wherein the bypass path contains a second high pass filter.

19. The method of claim 11, wherein the low frequency is a DC.

20. The method of claim 11 further comprises the step of ascertaining a second spurious resonance and second starting spurious resonance frequency.

* * * * *